(12) United States Patent
Cha et al.

(10) Patent No.: US 8,840,985 B2
(45) Date of Patent: Sep. 23, 2014

(54) COMPOSITION FOR FORMING INORGANIC PATTERN AND METHOD FOR FORMING INORGANIC PATTERN USING THE SAME

(75) Inventors: Seung Nam Cha, Seoul (KR); Dae Joon Kang, Suwon-si (KR); Byong Gwon Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1743 days.

(21) Appl. No.: 12/200,435

(22) Filed: Aug. 28, 2008

(65) Prior Publication Data

US 2009/0258188 A1 Oct. 15, 2009

(30) Foreign Application Priority Data

Apr. 14, 2008 (KR) .................. 10-2008-0034165

(51) Int. Cl.
| | |
|---|---|
| *B32B 27/36* | (2006.01) |
| *B32B 7/02* | (2006.01) |
| *B82Y 10/00* | (2011.01) |
| *B81C 1/00* | (2006.01) |
| *G03F 7/00* | (2006.01) |
| *G03F 7/004* | (2006.01) |
| *B82Y 40/00* | (2011.01) |

(52) U.S. Cl.
CPC ............ *G03F 7/0002* (2013.01); *B82Y 10/00* (2013.01); *B81C 1/00031* (2013.01); *G03F 7/0042* (2013.01); *B82Y 40/00* (2013.01)
USPC ........................ 428/212; 428/137; 423/508

(58) Field of Classification Search
USPC ..................... 428/137, 411.1, 212; 423/508
See application file for complete search history.

(56) References Cited

U.S. PATENT DOCUMENTS

| | | | | |
|---|---|---|---|---|
| 3,322,742 | A | * | 5/1967 | Perry ............................ 526/172 |
| 5,645,634 | A | * | 7/1997 | Ogi et al. ................. 106/287.19 |
| 6,066,581 | A | | 5/2000 | Chivukula et al. |
| 2003/0215577 | A1 | | 11/2003 | Willson et al. |
| 2005/0049338 | A1 | * | 3/2005 | Ryang et al. .................. 524/115 |
| 2005/0186360 | A1 | * | 8/2005 | Oya et al. ........................ 428/1.1 |
| 2005/0233113 | A1 | * | 10/2005 | Kotani et al. ................. 428/141 |
| 2006/0078736 | A1 | * | 4/2006 | Fukazawa et al. ............ 428/407 |
| 2008/0032443 | A1 | * | 2/2008 | Wu et al. ....................... 438/104 |

FOREIGN PATENT DOCUMENTS

| | | |
|---|---|---|
| GB | 2347145 A | 8/2000 |
| JP | 06166501 | 6/1994 |
| JP | 2003255522 | 9/2003 |
| JP | 2004074006 | 3/2004 |

OTHER PUBLICATIONS

Shinmou, et al., "Fine-patterning of ZrO2 thin films by photolysis of chemically modified gel films", Japan J. Appl. Phys., vol. 33 (1994), pp. L 1181-L 1184 Part 2, No. 8B, (Publ. Aug. 15, 1994).
Voicu, N, et al., "TiO2 Patternining using electro-hydrodynamic lithography", Soft Matter, 2007, vol. 3(5), pp. 554-557.
European Search Report for Application No. 08163689.6-1226/2116899 dated Mar. 11, 2011.

\* cited by examiner

*Primary Examiner* — Aaron Austin
*Assistant Examiner* — Lawrence Ferguson
(74) *Attorney, Agent, or Firm* — Cantor Colburn LLP

(57) ABSTRACT

Disclosed herein is a composition for forming an inorganic pattern, comprising an inorganic precursor, at least one stabilizer selected from β-diketone and β-ketoester, and a solvent. Use of the composition enables efficient and inexpensive formation of an inorganic micropattern.

3 Claims, 4 Drawing Sheets

A          B

A     B     C     D

COMPOSITION FOR FORMING INORGANIC PATTERN AND METHOD FOR FORMING INORGANIC PATTERN USING THE SAME

This non-provisional application claims priority to Korean Patent Application No. 10-2008-0034165, filed on Apr. 14, 2008, and all the benefits accruing therefrom under U.S.C. §119, the content of which is incorporated herein by reference in its entirety.

BACKGROUND OF THE INVENTION

1. Field of the Invention

This disclosure is directed to a composition for forming an inorganic pattern and a method for forming an inorganic pattern using the same. More specifically, this disclosure is directed to a composition for forming an inorganic pattern, comprising an inorganic precursor, at least one stabilizer selected from β-diketone and β-ketoester, and a solvent, and to a method for forming an inorganic pattern using the same.

2. Description of the Related Art

With advanced semiconductor technology, conventional microstructure fabrication techniques, in particular photolithography (also referred to as "optical lithography") has with constant advances in optics and materials attained excellent results in terms of process precision, accuracy and reproducibility. However, as the current trend is toward still higher levels of integration and larger device areas, there is an increasing demand for the development of a new technology capable of achieving formation of such micropatterns (nano- or micro-scale) by a more convenient and less expensive method.

Soft lithography has received attention as a technique for low-cost formation of micropatterns. Numerous attempts have been made to form patterns using soft lithography techniques with an organic-based resist. However, due to intrinsic limitations of these organic materials, soft lithography methods do not convey any more functionality than to serve as an intermediate step of pattern transfer.

Inorganic materials including oxides and nitrides however have become increasingly important as leading materials for fabricating electronic components for the next-generation growth engine industries such as information technology ("IT"), biotechnology ("BT"), nanotechnology ("NT"), and the like. To cope with such a current trend, patterning of these inorganic materials into nano- or micro-scale structures on a large area of the device may be performed. However, reports of satisfactory results for the method have not been found, likely due to the numerous technical limitations. There remains therefore a strong need for development of materials and methods which are capable of achieving the formation of inorganic patterns on a commercial production scale, at low cost.

BRIEF SUMMARY OF THE INVENTION

In an embodiment, a composition for forming an inorganic pattern is disclosed, which comprises an inorganic precursor, at least one stabilizer selected from β-diketone and β-ketoester, and a solvent.

The composition prepared from these precursors is capable of readily forming an inorganic pattern at a low production cost.

In another embodiment, a method for forming an inorganic pattern comprises:

mixing an inorganic precursor, a stabilizer and a solvent to prepare a reaction mixture;

applying the reaction mixture to a substrate, followed by patterning of the resulting inorganic thin film using electrohydrodynamic lithography; and evaporating the solvent to obtain an inorganic pattern.

In an embodiment, an inorganic pattern comprises the reaction product of a composition comprising an inorganic precursor, at least one stabilizer selected from β-diketone and β-ketoester, and a solvent, wherein the inorganic pattern has a pattern resolution of about 2 nm to about 100 nm.

The method is capable of providing patterned devices with excellent processability and cost reduction.

In an embodiment, the patterning step of electrohydrodynamic lithography includes applying the reaction mixture to a substrate disposed between opposing surfaces of upper and lower electrodes, to form a thin film; and applying an electric or magnetic field to the upper and lower electrodes to generate an electric force in the reaction mixture, thereby patterning the thin film. An electrode patterned to have a specific pattern may be used as the upper electrode.

The inorganic precursor may be a metal alkoxide or composite metal alkoxide. The stabilizer is added to prevent degeneration or precipitation of the inorganic precursor, and may include, for example, β-diketones such as benzoylacetone and acetylacetone, and β-ketoesters such as methyl acetoacetate, ethyl acetoacetate, isopropyl acetoacetate, and isobutyl acetoacetate.

BRIEF DESCRIPTION OF THE DRAWINGS

Exemplary embodiments will be more clearly understood from the following detailed description taken in conjunction with the accompanying drawings, in which.

DETAILED DESCRIPTION OF THE INVENTION

Figure 1:
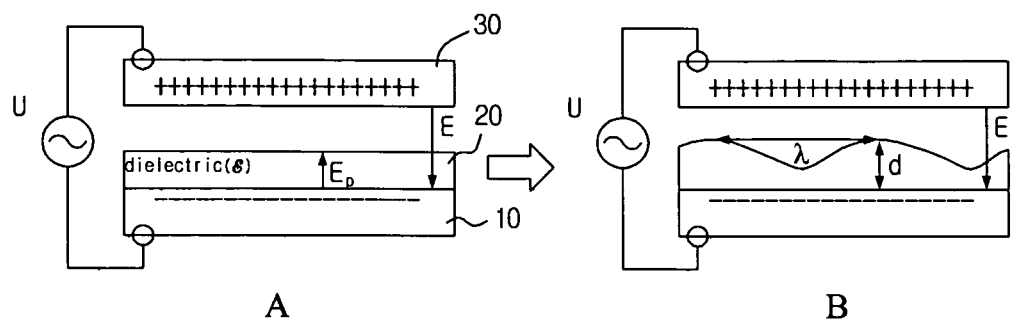
FIG. 1 is a schematic view illustrating a principle of exemplary electrohydrodynamic patterning employed herein.

Hereinafter, a detailed description will be given of the exemplary embodiments with reference to the accompanying drawings.

It will be understood that when an element or layer is referred to as being "on," "interposed," "disposed," or "between" another element or layer, it can be directly on, interposed, disposed, or between the other element or layer or intervening elements or layers may be present.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, first element, component, region, layer or section discussed below could be termed second element, component, region, layer or section without departing from the teachings of the present invention.

As used herein, the singular forms "a," "an" and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In an embodiment, a composition for forming an inorganic pattern is provided, comprising an inorganic precursor, at least one stabilizer selected from β-diketone and β-ketoester, and a solvent. The composition is used in the formation of inorganic patterns using an electrohydrodynamic lithography technique, or the like.

As disclosed herein, an inorganic precursor may be a metal oxide precursor or metal nitride precursor. Examples of the metal oxide precursor may include metal alkoxides and composite metal alkoxides.

The stabilizer serves to stabilize the inorganic precursor (for example, metal alkoxides) to thereby prevent degeneration or precipitation of the reaction mixture for formation of patterns after synthesis of the materials necessary for the pattern-forming composition. Examples of the stabilizer that can be used include, but are not limited to, β-diketones such as benzoylacetone and acetylacetone, and β-ketoesters such as methyl acetoacetate, ethyl acetoacetate, isopropyl acetoacetate, and isobutyl acetoacetate. These materials may be used alone or in any combination thereof.

There is no particular limit to the solvent used. Examples of the solvent may include aliphatic hydrocarbons, aromatic hydrocarbons, ketones, ethers, acetates, alcohols, amides, and liquid silicones. These materials may be used alone or in any combination thereof. Specific examples of the solvent include, but are not limited to, toluene, methoxyethanol, and isopropyl alcohol ("IPA"). The amount of solvent added during the patterning process varies depending upon the viscosity of the inorganic material, and other components.

In another embodiment, a method is provided which is capable of forming a nano- or micro-scale inorganic pattern at low production costs. When it is desirable to fabricate an inorganic pattern, the inorganic precursor, stabilizer and solvent are first mixed to prepare a reaction mixture. Then, the reaction mixture is applied to a substrate, followed by patterning of the resulting inorganic thin film by electrohydrodynamic lithography. After the electrohydrodynamic patterning is complete, the solvent is evaporated to obtain an inorganic pattern.

Conventional methods for forming inorganic patterns have been primarily carried out in an expensive lithography facility, or using a process which involves pattern transfer using an organic resist and etching or vapor-deposition to obtain the desired pattern. On the other hand, the method in accordance with this disclosure can provide a final product via direct patterning of the inorganic material using the electrohydrodynamic method, which can result in a simplification of the imaging process and commensurate improvement in economic efficiency.

The inorganic pattern obtained by the method of this disclosure is made of an oxide or nitride and may be synthesized in various forms, depending upon desired applications such as dielectrics, semiconductors, magnetic materials, insulating materials, and the like. When the inorganic material applied to the substrate surface is patterned by electrohydrodynamic lithography, replication or new formation of the pattern can be made through control of the surface microstructure of an electrode.

The electrohydrodynamic patterning step comprises applying the reaction mixture to a substrate disposed between opposing surfaces of upper and lower electrodes, to form a thin film; and applying an electric or magnetic field to the upper and lower electrodes to generate an electric force in the reaction mixture, to convert the inorganic precursor into an inorganic material such as metal oxide or metal nitride.

Figure 2:
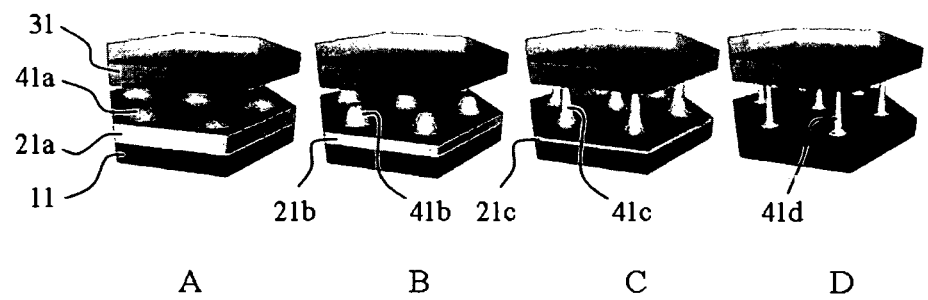
FIG. 2 is a schematic view illustrating individual steps of an exemplary electrohydrodynamic patterning process in an embodiment.

Patterning of the inorganic material is carried out while taking advantage of an electrohydrodynamic phenomenon which will be described in detail as follows. FIG. 1 is an exemplary schematic view illustrating patterning of the inorganic material on a substrate by means of the electrohydrodynamic phenomenon. FIG. 2 is an exemplary schematic view illustrating sequential steps for fabrication of patterns by means of the electrohydrodynamic lithography process.

As shown in FIG. 1 (see A), when an electric field is applied between the upper and lower electrodes 10,30, an electrostatic force (E) (and opposed by $E_p$ the internal dielectric field of the dielectric) is generated between an air layer and a dielectric reaction mixture 20, so the dielectric will have a peak-to-peak wavelength of λ (see B) resulting in amplification of instability. Due to being exposed to a gradient of the electric field over time, the reaction mixture 20 placed within the electric field will lose its inherent surface tension and then exhibit a regular wave pattern (λ). As shown in FIG. 2 in the progression A-D, the regular wave patterns (41a to 41d) increase in amplitude between electrodes 11 and 31 with increasing power and time, and show with a commensurate decrease in the liquid dielectric distributed in the liquid dielectric layer (21a to 21c). When the reaction mixture 20 makes contact with the upper electrode 30 when the wave height d is increases with time and field intensity, localization of the dielectric occurs in a regular pattern. Depending upon intensity of an electric field applied, the amount of time for which the field is applied, and the position of the upper electrode, the reaction mixture, as shown in FIG. 2, may undergo columnar growth (see FIG. 2, D and 41d).

Equation 1 illustrates pattern size-determining factors in the electrohydrodynamic lithography. From Equation 1, it can be seen that pattern shape and morphology including pattern spacing (λ) may be controlled by various factors such as surface tension of the inorganic material, the applied electric field, and like parameters.

[Equation 1]

$$\lambda = 2\pi \sqrt{\frac{\gamma U}{\varepsilon_0 \varepsilon (\varepsilon - 1)} E_p^{-3/2}} \quad \text{(Equation 1)}$$

In Equation 1,
λ represents a pattern spacing,

γ represents surface tension of a reaction mixture,
∈ represents permittivity of a reaction mixture,
$∈_0$ represents vacuum permittivity,
U represents intensity of a voltage applied between upper and lower electrodes, and
$E_p$ represents an internal electric field of a dielectric.

Between the upper and lower electrodes 10,30 a variety of electric or magnetic fields may be applied, such as for example an alternating current ("AC") field, a direct current ("DC") field, and/or a magnetic field, which may be applied alone or in any combination thereof. Various forms of inorganic structures may form depending upon the methods of application of these electric or magnetic fields.

Figure 3:
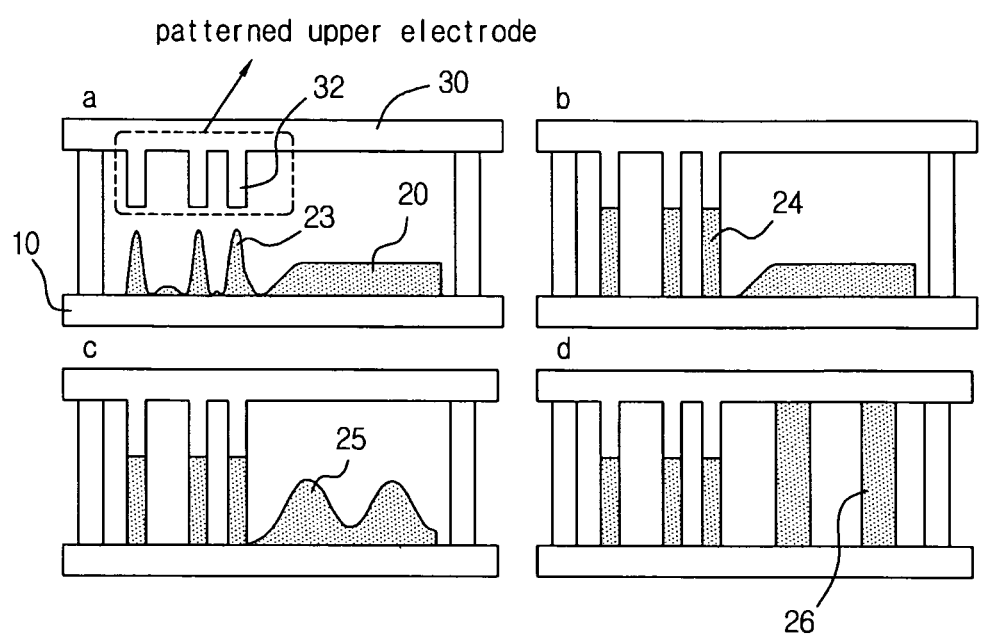
FIG. 3 is a schematic view illustrating an exemplary electrohydrodynamic patterning process when the patterned upper electrode is used.

In another embodiment, an electrode with formation of a predetermined pattern may be used as the upper electrode, when patterning is carried out by electrohydrodynamic lithography. FIG. 3 shows an exemplary schematic view illustrating formation of an inorganic pattern by electrohydrodynamic lithography using the patterned electrode. As shown in FIG. 3a, when the upper electrode 30 is patterned to have protrusions 32, the portion of liquid dielectric 23 (see FIG. 3a) proximate to the lower electrode 10 is highly susceptible to an electric field. As a result, the applied reaction mixture 20 rapidly undergoes deformation to result in faster formation of patterns, as compared to non-protruding flat portions. Use of the patterned upper electrode 30,32 may result in formation of an inorganic pattern 24 (see FIG. 3b) on which the pattern 32 of the upper electrode 30 was replicated.

The reaction mixture 25 in the protrusion-free portion (i.e., the non-protruded part) of the upper electrode 30 exhibits sluggish formation of patterns, as compared to the reaction mixture 23 in the protruded portion 32. However, when the intensity of the applied electric field is sufficiently high or the electric field is applied for a sufficient long period of time, such a protrusion-free portion may also undergo formation of patterns 25, 26 (see FIGS. 3c and 3d). Thus, use of the patterned upper electrode 30 enables fabrication of various forms of nanostructures. That is, in addition to the voltage applied to the upper and lower electrodes, and the viscosity of the inorganic material, the sizes, forms and arrangements of the patterns may be controlled by the form of the upper electrode.

In another embodiment, the upper electrode 30 may be raised (i.e., the separation between upper electrode 30 and lower electrode 10 may be increased) after contact is made between the reaction mixture 20 and the upper electrode 30. If the upper electrode is elevated upward, a longer inorganic structure (24, 26) can be formed. Depending upon the rate of elevation of the upper electrode 30 (relative to lower electrode 10) and the electric field intensity, it is possible to control the dimension and morphology of the pattern formed.

In an embodiment, the reaction mixture contains an inorganic precursor, a stabilizer and a solvent. Specifically, the inorganic precursor may include metal oxide precursors and metal nitride precursors, where the metal oxide precursor may include metal alkoxides and composite metal alkoxides. Examples of the metal alkoxide may include, but are not limited to, metal methoxide, ethoxide, propoxide, isopropoxide, butoxide, or combinations thereof. Examples of the metal include zinc, zirconium, hafnium, titanium, lanthanum, gadolinium, vanadium, cerium, yttrium, aluminum, and combinations thereof.

The stabilizer serves to stabilize the inorganic precursor (for example, metal alkoxides) by inhibiting hydrolysis occurring during the chemical reaction to prevent degeneration or precipitation of the reaction mixture for formation of electrohydrodynamic patterns after synthesis of the materials necessary for the pattern-forming composition. The stabilizer is added primarily to the reaction process which undergoes the hydrolysis. Non-limiting examples of the stabilizer include β-diketones such as benzoylacetone and acetylacetone, and β-ketoesters such as methyl acetoacetate, ethyl acetoacetate, isopropyl acetoacetate, and isobutyl acetoacetate. These materials may be used alone or in any combination thereof.

A solvent is necessary for preparation of a reaction mixture by mixing the inorganic precursor and the stabilizer. There is no particular limit to the solvent that can be used in this disclosure the solvent may include aliphatic hydrocarbons, aromatic hydrocarbons, ketones, ethers, acetates, alcohols, amides, and silicones. These materials may be used alone or in any combination thereof. Specific examples of the solvents include, but are not limited to, toluene, methoxyethanol, and IPA. The content of the solvent added during the patterning process may vary depending upon the viscosity of the inorganic material, and the like.

The reaction mixture for the electrohydrodynamic lithography may be applied to a substrate by any conventional wet coating method known in the art. For example, application of the reaction mixture may be carried out by spin coating, spray coating, screen printing, inkjet printing, drop casting, or like methods.

An apparatus used in the electrohydrodynamic lithography thus comprises an upper electrode, a lower electrode spaced at a distance from the upper electrode, and a voltage applicator which generates an electric force in the reaction mixture via application of a voltage to the upper electrode and the lower electrode such that an electric field is formed around the reaction mixture.

The substrate may be fabricated of silicon, glass, indium-tin oxide ("ITO") coated glass, plastic, or the like. The upper electrode for formation of an electric field is electrically connected to the voltage applicator. The upper electrode may be an electrode having a conductive nanostructure formed on the substrate. There is no particular limit to the conductive nanostructure, as long as it exhibits suitable conductivity. For example, the conductive nanostructure may include at least one nanostructure selected from the group consisting of various metal patterns, conductive polymers, carbon nanotubes, and a combination thereof. The lower electrode is separate from and spaced apart from the upper electrode, with a gap between the electrodes, and in combination with the upper electrode, forms an electric field when a voltage is applied across the upper and lower electrodes.

The voltage applicator may be configured such that a DC or AC voltage or a combination thereof is applied with a specific frequency. Alternatively, a magnetic field may also be applied. The shape and morphology of the pattern are affected by the electric field to be applied. For example, a DC electric field of about 1 V/μm to about 100 V/μm may be applied. An AC electric field may have a frequency of about 40 Hz to about 1,000 Hz.

A curing step to obtain an inorganic pattern may be carried out by heating the patterned substrate at a temperature of about 250 to about 700° C. for about 5 min to about 3 hours or by UV or IR irradiation. However, such curing conditions may vary depending upon several factors such as the type of inorganic precursors, the reaction mixture viscosity, and the like.

The inorganic pattern, which is fabricated by using the composition for forming an inorganic pattern in accordance with this disclosure, may be a pattern of a semiconductor material, insulating material or magnetic material. For example, the inorganic pattern of this disclosure may be a pattern of metal oxides such as ZnO, $HfO_2$, $ZrO_2$, $Gd_2O_3$, $La_2O_3$, $VO_2$, $CeO_2$, $TiO_2$, $Y_2O_3$, $Ta_2O_5$ and $Al_2O_3$, or a pattern of nitrides such as AlN. Further, it is possible to obtain a pattern of a magnetic material such as yttrium-iron garnet ("YIG") or $Fe_2O_3$. The inorganic pattern may have a pattern resolution of about 2 nm to about 100 nm. The pattern resolution depends on and is controlled by various factors such as the structure of the upper electrode, surface tension and permittivity of the inorganic material, properties of the applied electric field, and like factors.

The inorganic pattern of this disclosure may be used as a seed for synthesis of various forms of nanostructures. Growth of the nanostructure from the seed may be carried out by any conventional method known in the art, such as thermal chemical vapor deposition ("CVD"), wet process, and like processes. In the case of the nitride and oxide nanostructures, it is possible to induce selective epitaxial growth in the same material or depending upon crystal properties of the nanostructures. Therefore, a homogeneous or heterogeneous nanostructure (for example, nanowires) may be grown from the inorganic pattern and used in a variety of application fields. For example, the inorganic nanostructure patterns fabricated in accordance with this disclosure may be used for various applications, such as light-emitting devices (for example, LEDs and laser diodes), photoelectric conversion elements (for example, solar cells), optical devices, sensors, magnetic recording media, and the like.

A better understanding of exemplary embodiments will be described in more detail with reference to the following examples. These examples are exemplary and for the purpose of illustration only, and are not to be construed as limiting the scope of the embodiments.

EXAMPLES

Example 1

Figure 4A:
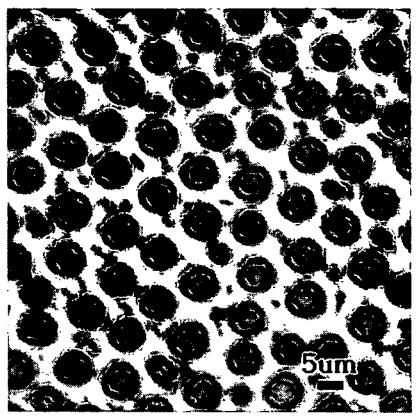
FIG. 4a is a microscopic image of an exemplary substrate with formation of ZnO pattern obtained in Example 1.
Figure 4B:
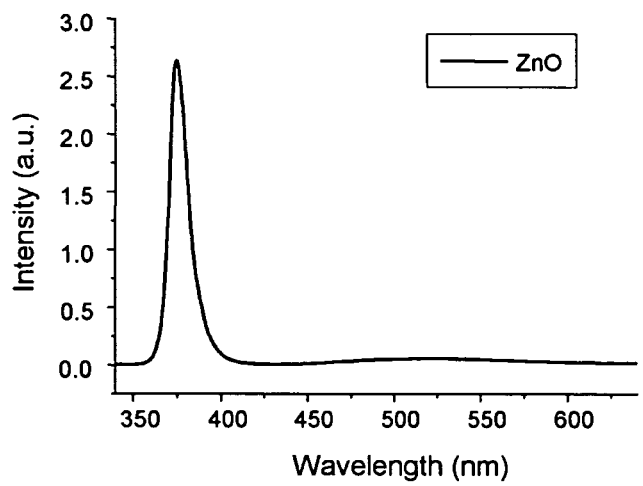
FIG. 4b is a graph showing the photoluminescence ("PL") results for the exemplary substrate obtained.

Formation of ZnO Pattern 1.5 mmol of zinc 2-methoxyethoxide was mixed with an equimolar amount (1.5 mmol) of benzoylacetone under a dry atmosphere with a relative humidity ("RH") of less than 5%. 0.5 mL of the resulting mixture was then mixed with 2.5 mL of IPA as a solvent to prepare a composition for forming an inorganic pattern. The reaction mixture was spin-coated on a silicon substrate with Cr deposited to a thickness of 100 nm as an electrode, 2 V/μm of a DC electric field was applied between the silicon substrate and an Au-coated upper electrode placed over the Cr electrode so as to leave a gap between the reaction mixture layer and the Au electrode, and the substrate was allowed to stand at room temperature for 1 hour such that the applied dielectric composition formed a pattern with regular spacing. The patterned lower (i.e., Cr) substrate was annealed at 500° C. for 3 hours under atmospheric pressure to convert the zinc precursor into ZnO, followed by removal of residual organic material. As the upper electrode, non-patterned uniform conductive gold (Au) thin film was used. FIG. 4a shows a microscopic image of the ZnO-patterned substrate, and FIG. 4b shows a plot of the PL results of the pattern measured after annealing. Referring to FIG. 4b, the main PL peak was measured to occur at about 380 nm, which is consistent with the PL results of a conventional ZnO material.

Example 2

Figure 5:
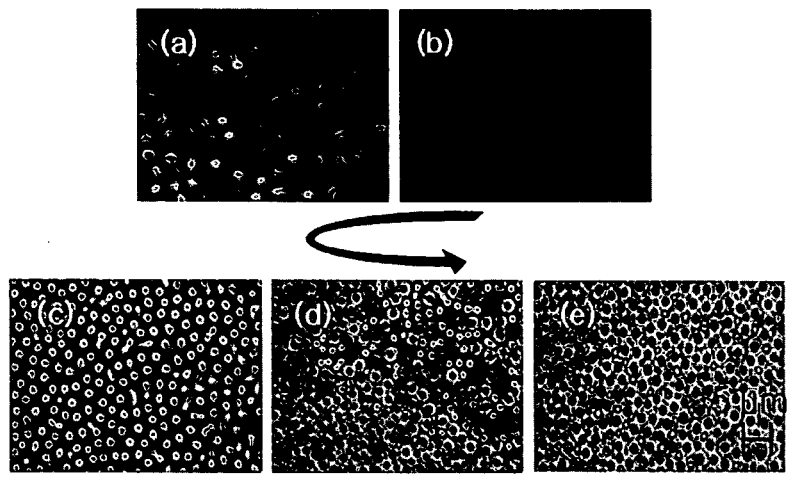
FIG. 5 is a series of microscopic images illustrating formation of an exemplary $TiO_2$ pattern in Example 2, taken at intervals of 30 min after an electric field is applied.

Formation of $TiO_2$ Pattern 5 mmol (0.85 mL) of titanium (IV) butoxide was mixed with 2.5 mmol (0.41 g) of benzoylacetone under an atmosphere with an RH of less than 5%, to which 15 mL of pentanol and 2.5 mL of methanol were then added. 5 mmol (based on Ti) of the resulting titanium (IV) butoxide solution was then mixed with an equimolar amount of methyl acetoacetate, and 8 ml of pentanol was then added thereto to prepare a composition for forming an inorganic pattern. Analogously to Example 1, a pattern was formed by electrohydrodynamic lithography. 20 V/μm of an electric field was applied between two substrates, and formation of the pattern was observed while maintaining the electric field for 2.5 hours. After formation of the pattern, annealing was carried out to remove residual solvent and organics at 500° C. for 3 hours under a hydrazine gas atmosphere, resulting in formation of $TiO_2$ pattern. After an electric field was applied during formation of the $TiO_2$ pattern, microscopic images were taken at intervals of 30 min. The results thus obtained are shown in FIGS. 5a to 5e, in which the growth of the annealed pattern can be seen progressing from nascent (in FIG. 5a), to fully formed and annealed (FIG. 5e).

Example 3

Formation of $TiO_2$ Pattern Using Patterned Upper Electrode

Figure 6A:
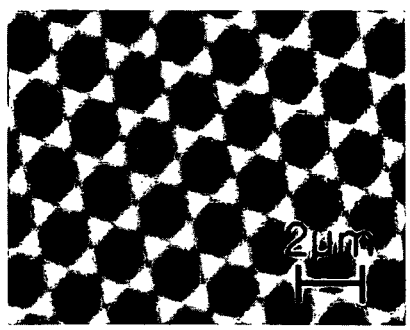
FIG. 6a is a microscopic image of the exemplary patterned upper electrode used in Example 3.
Figure 6B:
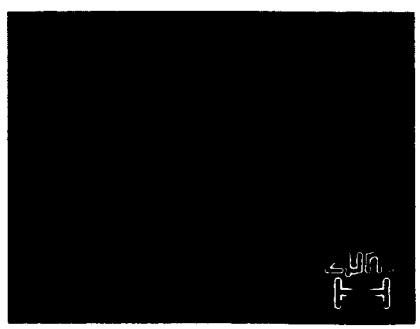
FIG. 6b is a microscopic image of the exemplary pattern replicated in Example 3.

A pattern was formed in the same manner as in Example 2, except that a patterned conductive Au thin film as shown in FIG. 6a was used as an upper electrode. A microscopic image of the replicated pattern is shown in FIG. 6b.

Although exemplary embodiments have been disclosed for illustrative purposes, those skilled in the art will appreciate that various modifications, additions and substitutions are possible, without departing from the scope and spirit of the invention as disclosed in the accompanying claims.

What is claimed is:

1. A composition for forming an inorganic pattern, the composition consisting of:
   an inorganic precursor, wherein the inorganic precursor is a zinc alkoxide;
   at least one stabilizer selected from a β-ketoester; and
   a solvent,
   wherein the composition is used for a pattern of zinc oxide having a resolution of about 2 nanometers to about 100 nanometers by electrohydrodynamic lithography.

2. The composition of claim 1, wherein the inorganic precursor is zinc 2-methoxyethoxide.

3. The composition of claim 1, wherein the β-ketoester is at least one selected from the group consisting of methyl acetoacetate, ethyl acetoacetate, isopropyl acetoacetate, isobutyl acetoacetate, and combinations thereof.

* * * * *